Figure 1:
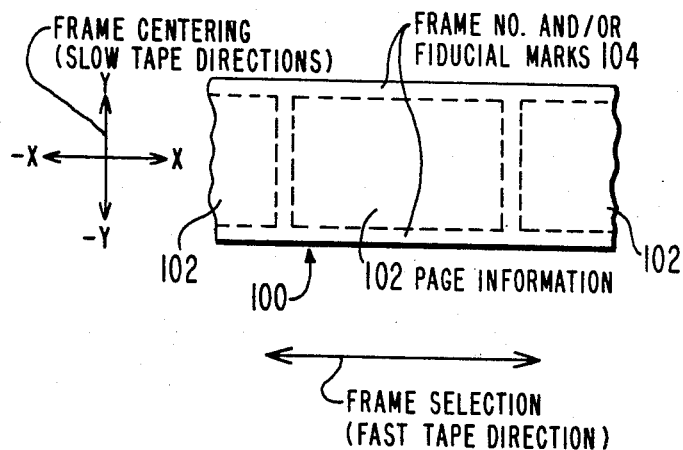

United States Patent [19]

Clay

[11] 4,289,372
[45] Sep. 15, 1981

[54] TECHNIQUE FOR RECORDING A HOLOGRAM SUITABLE FOR USE IN OPTICAL RETRIEVAL SYSTEM

[75] Inventor: Burton R. Clay, Wayland, Mass.
[73] Assignee: RCA Corporation, New York, N.Y.
[21] Appl. No.: 42,922
[22] Filed: May 29, 1979
[51] Int. Cl.³ .......................... G03H 1/04; G03H 1/16
[52] U.S. Cl. ....................... 350/3.83; 350/3.79
[58] Field of Search ............... 350/3.69, 3.73, 3.75, 350/3.77, 3.79, 3.82, 3.83, 3.85

[56] References Cited

U.S. PATENT DOCUMENTS

| | | | |
|---|---|---|---|
| 3,511,553 | 5/1970 | Gerritsew et al. | 350/3.79 |
| 3,887,276 | 6/1975 | Clay et al. | 350/3.5 |
| 3,914,056 | 10/1975 | Mottier et al. | 350/3.75 |
| 3,990,773 | 11/1976 | Gore | 350/3.5 |
| 3,995,146 | 11/1976 | Tetrev | 350/3.5 |

*Primary Examiner*—John K. Corbin
*Assistant Examiner*—Bruce Arnold
*Attorney, Agent, or Firm*—Samuel Cohen; George J. Seligsohn

[57] ABSTRACT

A hologram recording system useful for recording holograms for use on a film strip tape in an optical retrieval system is disclosed. The recording system permits accurate centering of a selected one of a series of frames. A hologram for use on a film strip tape is recorded with interfering divergent beams of $\lambda_1$ wavelength coherent wave energy for readout with a plane wave of $\lambda_2$ wavelength coherent wave energy to provide a reconstruction in a plane spaced a preselected distance $Z_3$ from the plane of the hologram record being read out. The respective distances $Z_1$ and $Z_2$ of the effective optical crossovers of the two divergent recording beams from the plane of the hologram recording medium are uniquely functionally related to the preselected distance $Z_3$ and the ratio $\lambda_2/\lambda_1$.

9 Claims, 5 Drawing Figures

TECHNIQUE FOR RECORDING A HOLOGRAM SUITABLE FOR USE IN OPTICAL RETRIEVAL SYSTEM

This invention relates to a system for recording a hologram useful in an optical retrieval system and, more particularly, to the recording of a certain type of hologram for use on a film strip tape which permits simple, accurate centering of a selected one of a series of frames on page information recorded on the film strip tape.

Many optical information retrieval systems, in which pages are stored as frames on a film strip tape, involve a film transport which moves the film rapidly until the desired frame is located and then stops. Then, at a lower film velocity, the frame is centered in an aperture. This latter step is necessary to correct undershoot or overshoot and to enable examination of a selected portion of the frame. One practice is to identify each frame by a specific code number. This is generally a binary number recorded on the frame. In order to center the frame in the readout aperture, more fiducial marks are also added. Detection of these optical signals by photodetectors provides the electronic inputs necessary for tape transport control.

The use of an embossed Fraunhofer hologram frame address approach is disclosed in U.S. Pat. No. 3,887,276, which issued June 3, 1975 to Gore and Clay; U.S. Pat. No. 3,990,773, which issued Nov. 9, 1976 to Gore and U.S. Pat. No. 3,995,146, which issued Nov. 30, 1976 to Tetrev. This approach has several advantages. First, embossing the frame address is less expensive then recording the frame address on each copy. Second, the redundancy of a hologram provides higher reliability because of the immunity to scratches and dirt. Third, the time duty cycle of the readout code is greatly increased by the use of a Fraunhofer hologram, because no image motion occurs in the direction of film retrieval motion. Since the frame address readout remains stationary as the film moves on the detector array, the time required for the electronic processing is almost as long as the frame transition time. If the binary-coded frame address number had been a direct image on the film (rather than a Fraunhofer hologram), the duty cycle would have been very short, since the image moves rapidly over the detector.

In the systems disclosed in the aforesaid U.S. Patents, the frame address is holographically recorded in a quite simple manner from an opaque object comprising an array of shuttered apertures, each of which represents a different binary place value. However, when frame-centering is also required, the recording problem becomes more complex. More specifically, frame-centering requires that two-dimensional fiducial marks be recorded (for later embossing on copies) which are accurately positioned with a very high degree of precision. In particular, the recorded fiducial marks for X and Y displacement are respectively derived from each of two separate interferometers required to process the fiducial-mark recording light beams. This complexity leads to the necessity for using two separate recording tables, each with its own set of optics and its own laser. Finally, the film must be taken from one table to the other in order to superimpose all the necessary exposures required for the frame-address information, the fiducial-mark information, and the page information on each frame.

Assuming that the length of the film-strip tape is along the X direction, the present invention is directed to an approach which allows a Y-fiducial hologram (with the Y direction being perpendicular to the X direction) to be combined with each frame-address hologram. This leads to a simplification of the recording procedure and a simplification of both the readout optics and readout electronics.

In accordance with the principles of the present invention, on each frame a hologram is recorded that has Fresnel properties in the Y direction (i.e., the reconstructed image moves in the Y direction as the hologram moves in the Y direction and by the same amount). However, the hologram preferably has Fraunhofer properties in the X direction (i.e., the image remains stationary as the hologram moves in the X direction). Further, the hologram is recorded at a first predetermined wavelength and is read out a second predetermined wavelength which is different from the first predetermined wavelength.

Figure 2:
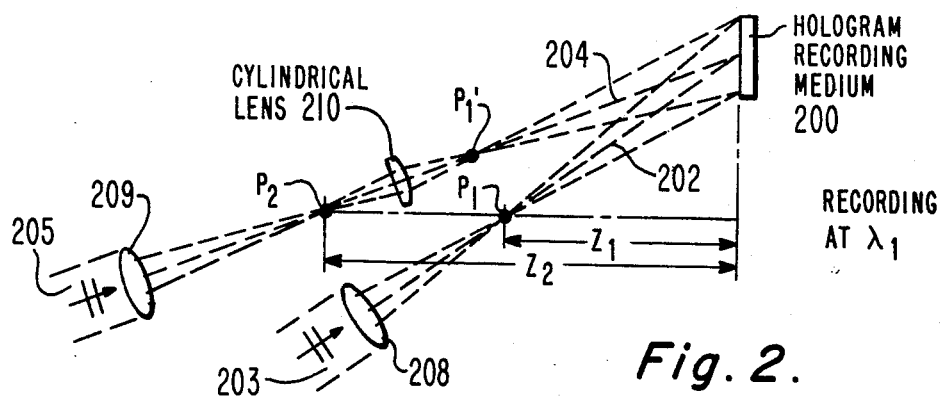
Figure 3:
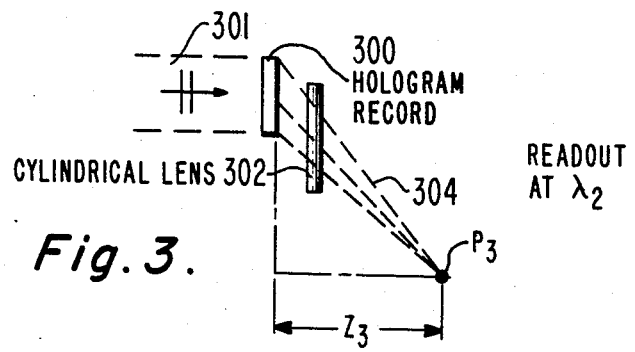
Figure 4A:
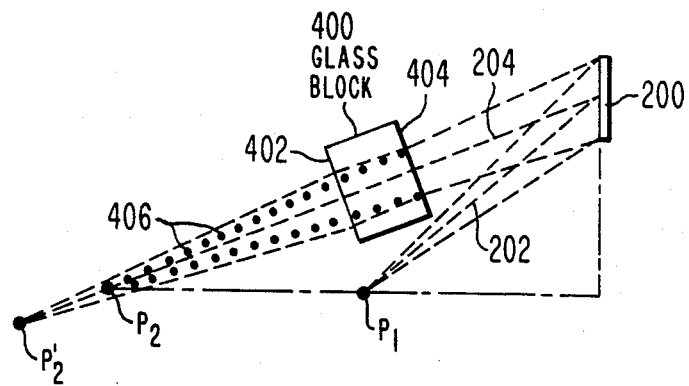
Figure 4B:
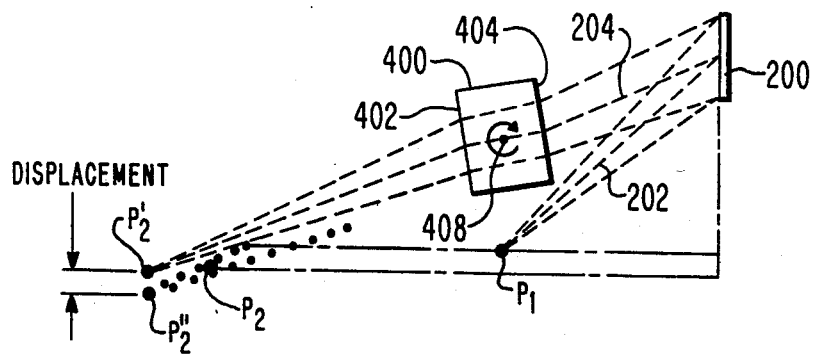

FIG. 1 illustrates a series of frames recorded on the film strip tape;

FIG. 2 schematically illustrates a generalized arrangement for recording a hologram of a single binary digit in accordance with the principles of the present invention;

FIG. 3 illustrates an arrangement for reading out a hologram record recorded in accordance with the principles of the present invention;

FIGS. 4a and 4b schematically illustrate a modification of the recording arrangement of FIGS. 2 for recording an array of many bits and fiducial marks.

Referring to FIG. 1, there is shown film strip tape 100 having a series of frame of page information 102. This page information may be alphanumeric and/or pictorial. In the upper and/or lower margin bordering each frame of page information 102 is recorded a frame number and/or fiducial marks 104. A film transport of an optical retrieval system (not shown) moves film strip tape 100 in a longitudinal (X) direction at a fast speed. The optical retrieval system detects each frame number 104 as it passes by and compares it to the frame number of a selected desired frame, a certain portion of which is to be projected. When the selected frame reaches and is detected within the aperture of the projection system, the film transport, in response to a control signal from the optical retrieval system, stops further movement of film strip tape 100 at fast speed in the longitudinal (X) direction.

As known in the art, projection of a selected portion of a selected frame is accomplished by controllably selecting the position of a movable projection aperture in both the horizontal (X) and vertical (Y) directions. However, this presupposes that the center of the selected frame is properly positioned with respect to the selected position of the projection aperture. Therefore, the optical retrieval system employs recorded fiducial marks to achieve frame centering after the selected frame has been reached. Frame centering is achieved by slowly moving film strip tape 100 back and forth in both the X and Y directions until the fiducial marks are detected.

In accordance with the present invention, both frame number and fiducial marks 104 are holographically recorded as an embossed relief pattern in the surface of the top and/or bottom margins bordering each frame of film strip tape 100. Further, each frame of page information 102 also may be holographically recorded as a relief pattern in the surface of film strip tape 100 or, alternatively, each frame of page information 102 may be photographically recorded.

As is known in the art, a relief pattern hologram is usually recorded on the photoresist surface of a hologram recording medium, which is then used directly or indirectly as a master for embossing the recorded hologram in the surface of a thermoplastic film, such as film strip tape 100.

Coherent light having a wavelength in the blue portion of the spectrum is usually used for recording a hologram on a photoresist surface, because photoresist is more sensitive to short wavelength blue light than it is to light of longer wavelengths. Therefore, by way of example, it is assumed in the following discussion that 441.6 nm blue light is the wavelength $\lambda_1$ of the hologram recording coherent wave energy. However, solid state photodectors, usually employed in optical retrieval systems, are most sensitive in the infra-red portion of the light spectrum. Therefore, by way of example, it is assumed in the following discussion that 1060.0 nm infrared light is the wavelength $\lambda_2$ of the hologram readout coherent wave energy.

For illustrative purposes, it is further assumed that the frame number and/or fiducial marks 104 identifying each frame of page information 102 constitutes one or more holograms, each hologram having Fraunhofer properties in the X (horizontal) direction and Fresnel properties in the Y (vertical) direction. The frame number information is recorded solely as a Fraunhofer diffraction Pattern, while the frame-centering fiducial mark information is recorded as a Fresnel diffraction pattern.

Referring to FIG. 2, an area of hologram recording medium 200 is simultaneously illuminated with first incident beam of $\lambda_1$ coherent wave energy 202 and second incident beam of $\lambda_1$ coherent with the first beam wave energy 204. First incident beam 202 is derived from first plane-wave 203 of $\lambda_1$ coherent wave energy, which illuminates first lens 208. The lens 208 has its focus at $P_1$. Crossover $P_1$ is on a line perpendicular to the recording plane. First incident beam 202 then diverges from $P_1$ illuminating hologram recording medium 200. As indicated in FIG. 2, crossover $P_1$ is spaced a first distance $Z_1$ from the plane of hologram recording medium 200. (A pinhole spatial filter is centered at $P_1$.)

In a similar manner, second incident beam 204 is derived from plane-wave 205 of $\lambda_1$ coherent wave energy, which illuminates lens 209. The $\lambda_1$ coherent wave energy illuminating lens 209 is focused at $P_2$ (a pinhole filter is centered at $P_2$). This light diverges from $P_2$ and illuminates cylindrical lens 210. The power axis of cylindrical lens 210 is oriented perpendicular to the plane of paper. Crossover $P_2$ is on a line containing $P_1$ and this line is normal to the hologram plane.

Cylindrical lens 210 functions to image the light emerging from crossover $P_2$ to crossover $P_1'$, which is at substantially the same distance from hologram recording medium 200 as is crossover $P_1$ therefrom. More specifically, the focal length of cylindrical lens 210 and the distance between cylindrical lens 210 and crossover $P_2$ are selected (in accordance with the well known principle of geometric optics that the sum of the reciprocals of the object and image distances is equal to the reciprocal of the focal length of the lens) to situate crossover $P_1'$ at substantially the same distance from hologram recording medium 200 as is crossover $P_1$, therefrom. This results in the incident beams 202 and 204 in the plane of hologram recording medium and in a direction parallel to the plane of the paper having substantially the same curvature. Therefore, the recorded hologram, in this direction parallel to the plane of the paper, has Fraunhofer hologram properties. However, in a direction perpendicular to the plane of the paper (i.e., parallel to the axis of cylindrical lens 210), the recorded hologram has Fresnel properties.

In particular, the first wavefront has the same curvature in all meridians since it is spherical. The second wavefront is cylindrical and its difference in curvature in the meridian of curvature equality is zero. Thus the interference fringes in this plane are straight lines. However, the interference on the recording meridian 90° to that of curvature equality is that of a plane wavefront with a curved wavefront, so that the spatial intervals between fringes follow a Fresnel distribution. The fringes, therefore, are straight lines but with a spatial frequency that increases as the distance from the optical axis increases.

Thus, a recorded hologram has been produced which images an incident plane readout wavefront with its axis at normal incidence to the desired point $P_3$ (FIG. 3), if the hologram has a cylindrical lens adjacent to it. The cylindrical lens power meridian orientation is perpendicular to the plane of incidence (containing the two incident beam axis). The fringe line orientation is in the plane of the power meridian.

As indicated in FIG. 2, second crossover $P_2$ is spaced a second distance $Z_2$ from the plane of hologram recording medium 200.

Referring to FIG. 3, there is shown an arrangement for reading out hologram record 300, which may comprise a certain type of hologram recorded on hologram recording medium 200 with the recording system shown in FIG. 2. As shown in FIG. 3, hologram record 300, in response to being illuminated with plane-wave 301 of $\lambda_2$ wavelength coherent wave energy oriented substantially normal to the plane of hologram record 300, together with cylindrical lens 302, produces diffractive (first-order) convergent output beam 304, which reconstructs at a crossover $P_3$ in the plane of the paper. The lens 302 has its cylinder (non-power) axis in the plane of the paper axis cylinder (non-power) axis in the plane of the paper, as indicated in FIG. 3. Therefore, crossover $P_3$, which is unaffected by lens 302, is spaced a third distance $Z_3$ from the plane of hologram record 300. Cylindrical lens 302 is situated, as indicated, with its power axis perpendicular to the plane of the paper. Further, cylindrical lens 302 is spaced from crossover $P_3$ so that crossover $P_3$ is in the focal plane of cylindrical lens 302. Therefore, crossover is imaged by lens 302 to a point.

It can be shown, to a very close approximation of a trigonometric relationship, that the respective distances $Z_1$, $Z_2$ and $Z_3$ (shown in FIGS. 2 and 3) and the ratio $\alpha$ of the wavelength $\lambda_2$ to the wavelength $\lambda_1$ are determined in accordance with the following equations:

$$\frac{1}{Z_1} - \frac{1}{Z_2} = \frac{1}{Z_3} \quad (1)$$

$$\frac{1}{Z_1^3} - \frac{1}{Z_2^3} = \frac{1}{Z_3^3} \quad (2)$$

The recording system of FIG. 2 may be used for holographically storing a single bit code. More specifically, first incident beam 202 may be considered a reference beam and second incident beam 204 may be considered an information beam. In this case, a binary "one" is represented by the presence of second incident beam 204, while a binary "zero" is represented by the absence of second incident beam 204. Thus, in FIG. 3, the presence of an electrical output in a photodetector situated at crossover P$_3$ is indicative of a holographically stored binary "one", whereas the absence of such a signal from the photodetector is indicative of a holographically stored binary "zero". Since a single bit code is of limited use, FIGS. 4a and 4b illustrate certain modifications of the hologram recording system of FIG. 2 which permit a multi-bit code array to be holographically recorded in accordance with the principles of the present invention.

In practice, the only material difference in the arrangements shown in FIGS. 4a and 4b, from that shown in FIG. 2, is the transmission through glass block 400 of the $\lambda_1$ coherent wave energy which forms second incident beam 204. However, for clarity cylindrical lens 210 has been omitted from FIGS. 4a and 4b, since the difference in the arrangements of FIGS. 4a and 4b from that of FIG. 2 relate only to the Fresnel properties of the recorded hologram. From the point of view of the Fresnel diffraction pattern to be recorded on hologram recording medium 200 in FIGS. 4a and 4b, the only effect of the presence of glass block 400, situated in the optical path of second incident beam 204, is to displace the spatial position of the optical crossover corresponding to point P$_2$ in FIG. 2 from that of the physical crossover thereof. Since it is the spatial position of the effective optical crossover, rather than that of the physical crossover, that determines the Fresnel diffraction pattern to be recorded on hologram recording medium 200, P$_2$ is used, in FIGS. 4a and 4b, to designate the effective optical crossover spatial position, while P'$_2$ is used to designate the physical crossover spatial position.

Referring to FIG. 4a, faces 402 and 404 of glass block 400 are oriented substantially normal to the center line of second incident beam 204. Since glass block 400 has an index of refraction greater than its surroundings, the spatial position of the physical crossover P'$_2$ is moved back from the effective optical crossover P$_2$. More specifically, the lens (not shown in FIG. 4a) focuses $\lambda_1$ coherent wave energy at physical crossover P'$_2$. As indicated by the dashed lines, second incident beam 204 diverges in the plane of the paper from physical crossover P'$_2$, and then is refracted during its passage through glass block 400. This refraction changes the apparent spatial position of second incident beam 204 emerging from glass block 400 to that of effective optical crossover P$_2$, as indicated by encircled-lines 406 in FIG. 4a. Therefore, the interference pattern produced by first incident beam 202 and second incident beam 204 of the illuminated area of hologram recording medium 200 is unaffected by the presence of glass block 400, so long as glass block 400 has the orientation shown in FIG. 4a (i.e. with faces 402 and 404 oriented normal to the center line of second incident beam 204).

However, as shown in FIG. 4b, glass block 400 may be mounted for rotation about an axis 408 oriented perpendicular with the plane of the paper (hence, parallel to the aforesaid axis of the cylindrical lens, should it be present, and the aforesaid crossover lines). As indicated in FIG. 4b, when glass block 400 is rotated so that faces 402 and 404 are no longer normal to the center line of second incident beam 204, refraction by glass block 400 has the additional effect of displacing the apparent crossover of second incident beam 204 at recording medium 200 by an amount which, for small changes in angular position, is substantially proportional to the angular displacement of glass block 400. More specifically, physical crossover, P'$_2$ in FIG. 4b is still located at the actual crossover of the focused $\lambda_1$ coherent wave energy from which second incident beam 204 is derived. However, faces 402 and 404 of glass block 400 are now oriented obliquely to the center line of second incident beam 204. Thus, the spatial position of the physical crossover of the focused $\lambda_1$ coherent wave energy would have to be displaced from P'$_2$ to P"$_2$ in order to provide a second incident beam having its center line normal to the faces 402 and 404 in FIG. 4b (and, therefore, having a substantially identical wavefront at hologram recording medium 200 as that in FIG. 4a).

In the arrangements of FIGS. 4a and 4b, the effective optical distance (rather than the actual physical distance) of respective crossovers P'$_2$ and P"$_2$ from the plane of recording medium 200 is selected to still have the value of Z$_2$ (in accordance with equations 1 and 2 above). However, in the arrangement shown in FIG. 4b (with glass block 400 oriented at an oblique angle with respect to the center line of second incident beam 204), there is no straight line which is perpendicular to the plane of hologram recording medium 200 and still intersects both crossover line P$_1$ and the spatial position of the effective optical crossover line (corresponding to P$_2$) in FIG. 4b.

A hologram of a multi-bit code array may be recorded on hologram recording medium 200 employing the arrangement of FIGS. 4a and 4b. Specifically, hologram recording medium 200 is sequentially exposed (or, alternatively, depending upon the binary value of each bit, not-exposed) by both second incident (information) beam 204, and first incident (reference) beam 202. Each exposure occurs at a different preselected one of a plurality of different predetermined angular positions of glass block 400 (one of which may or may not be that shown in FIG. 4a). A hologram record 300, derived from a hologram recorded by the arrangement shown in FIGS. 4a and 4b, reconstructs the recorded multi-bit code array in response to being illuminating by readout beam 30. An array of photodetectors, each of which is positioned in coincidence where a readout crossover line (e.g. P$_3$), corresponding respectively to each one of the different bits of the code, may be used in an optical retrieval system of the type described above.

By way of example, a hologram was recorded, in accordance with the principles of the present invention, for use in an optical retrieval system in which the hologram readout distance Z$_3$ between the hologram record and the plane of the photodetector-array was 98 mm, and the readout wavelenght was 1060.0 nm. This hologram was recorded with reference and information beams of coherent wave energy having a recording wavelength of 441.6 nm. The reference beam diverged from an effective optical crossover spaced a distance Z$_1$ of 127 mm from the plane of the hologram recording medium and the information beam diverged from an effective optical crossover Z$_2$ spaced a distance 276 mm from the plane of the hologram recording medium. When this recorded hologram was read out with a readout beam having a diameter of 5 mm, the read out crossover had a diameter of only 0.026 mm. This is essentially the value obtainable from a diffraction limited system. Therefore, wavelength aberration may be reduced to insignificance, without requiring more complex and more costly known practices, which in general, do not work when the wavelength ratio of $\lambda_2 : \lambda_1$ is as high as 10600:4416.

Although the present invention, as described above, employs coherent wave energy translation means, including a cylindrical lens which provides incident reference and information hologram recording beams that have curvatures determined by equations (1) and (2) in only one of two orthogonal directions, it should be understood that such translation means could provide hologram recording beams which have these curvatures in both of two orthogonal directions, merely by omitting the cylindrical lens. Further the translation means could employ a refractive or reflective structure other than a glass block to vary the spatial position of the effective optical crossover $P_2$.

What is claimed is:

1. In a hologram recording system for recording an interference pattern having Fresnel properties in at least one of two orthogonal directions, on a recording medium with two angularly displaced interfering beams of coherent energy of a first given wavelength $\lambda_1$ to produce a certain type of hologram, said certain type of hologram being responsive on readout to the illumination thereof with a plane wave of coherent wave energy of a second given wavelength $\lambda_2$ which is oriented substantially normal to the plane of said hologram for diffractively deriving an output beam of coherent wave energy which coverges in at least said one of said two orthogonal directions and which has a crossover spaced a preselected distance $Z_3$ from the plane of said hologram; said hologram recording system comprising:

coherent wave energy translation means for simultaneously illuminating an area of said recording medium with (1) a first incident beam of said $\lambda_1$ coherent wave energy which diverges in at least said one of said two orthogonal directions from a first predetermined crossover spaced a distance substantially equal to $Z_1$ from the plane of said recording medium and (2) a second incident beam of said $\lambda_1$ wavelength coherent wave energy which diverges in at least said one of said two orthogonal directions from a second predetermined crossover spaced a distance substantially equal to $Z_2$ from the plane of said recording medium, and wherein the respective values of distances $Z_1$ and $Z_2$ are related to the preselected distance $Z_3$ substantially in accordance with the following equations:

$$\frac{1}{Z_1} - \frac{1}{Z_2} = \frac{1}{\alpha Z_3}, \text{ and}$$

$$\frac{1}{Z_1^3} - \frac{1}{Z_2^3} = \frac{1}{\alpha Z_3^3},$$

where $\alpha$ is equal to the ratio of $\lambda_2$ to $\lambda_1$.

2. The hologram recording system defined in claim 1, wherein said translation means comprises, first means for deriving said first incident beam with said first predetermined crossover having a first spatial position relative to the plane of said recording medium; and second means for deriving said second incident beam with said second predetermined crossover having a second spatial position relative to the plane of said recording medium such that there is at least one straight line connecting said first and second predetermined crossovers which is substantially perpendicular to the plane of said recording medium.

3. The hologram recording system defined in claim 2, wherein said first means includes a first lens illuminated by a first plane wave of $\lambda_1$ wavelength coherent wave energy for focusing said first plane wave substantially at said first spatial position of said first predetermined crossover, and wherein said second means includes a second lens illuminated by a second plane wave of $\lambda_1$ wavelength coherent wave energy for focusing said second plane wave substantially at said second spatial position of said second predetermined crossover.

4. The hologram recording system defined in claim 3, wherein said second means further includes a cylindrical lens oriented with its axis substantially parallel to said one of said two orthogonal directions, said cylindrical lens having a predetermined focal length and being situated at such a given distance with respect to its predetermined focal length from said second spatial position to image said second crossover at a third spatial position located at substantially the same distance from said recording medium as is said first spatial position therefrom, whereby both said first and second incident beams of said $\lambda_1$ wavelength coherent wave energy have substantially the same curvature in the other of said two orthogonal directions.

5. The hologram recording system defined in claim 1, wherein said translation means comprises:

first means for deriving said first incident beam with said first predetermined crossover having a first spatial position relative to the plane of said recording medium, and second means for deriving said second incident beam with said second predetermined crossover having a second spatial position relative to the plane of said recording medium such that there is no straight line connecting said first and second predetermined crossover which is substantially perpendicular to the plane of said recording medium.

6. The hologram recording system defined in claim 5, wherein said first means includes a first lens illuminated by a first plane wave of $\lambda_1$ wavelength coherent wave energy for focusing said first plane wave substantially at said first spatial position of said first predetermined crossover, and wherein said second means includes a second lens illuminated by a second plane wave of $\lambda_1$ wavelength coherent wave energy for focusing said second plane wave at a third predetermined crossover spatial position which is spatially separated from said second spatial position of said second predetermined crossover, and crossover-position converting means situated beyond said third crossover position in the path of diverging $\lambda_1$ wavelength coherent wave energy from said third crossover for deriving said second incident beam.

7. The hologram recording system defined in claim 6, wherein said crossover-position converting means is a block of an isotropic material having an index of refraction greater than its surroundings through which said $\lambda_1$ wavelength coherent wave energy from said third crossover is transmitted.

8. The hologram recording system defined in claim 7, wherein said block is rotatably mounted for selectably determining said second spatial position of said second predetermined crossover.

9. The hologram recording system defined in claim 7, wherein said block is a glass block.

* * * * *